(12) United States Patent
Sutardja et al.

(10) Patent No.: US 9,614,386 B2
(45) Date of Patent: Apr. 4, 2017

(54) METHOD AND APPARATUS FOR POWER SWITCHING

(71) Applicant: Marvell World Trade Ltd., St. Michael (BB)

(72) Inventors: Pantas Sutardja, Los Gatos, CA (US); Oscar M. Siguenza, San Jose, CA (US); Bin Jiang, Singapore (SG); Hsien-Chih Chao, San Jose, CA (US); Devang Trivedi, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 1024 days.

(21) Appl. No.: 13/708,509

(22) Filed: Dec. 7, 2012

(65) Prior Publication Data

US 2013/0147423 A1 Jun. 13, 2013

Related U.S. Application Data

(60) Provisional application No. 61/568,556, filed on Dec. 8, 2011.

(51) Int. Cl.
  *H02J 7/00* (2006.01)
  *G06F 1/32* (2006.01)
  *H03K 19/00* (2006.01)
  *G06F 1/26* (2006.01)

(52) U.S. Cl.
  CPC ............ *H02J 7/0052* (2013.01); *G06F 1/263* (2013.01); *G06F 1/266* (2013.01); *G06F 1/3287* (2013.01); *H03K 19/0013* (2013.01); *H03K 19/0016* (2013.01); *Y02B 60/1282* (2013.01)

(58) Field of Classification Search
  USPC ........................................................ 320/107
  See application file for complete search history.

(56) References Cited

U.S. PATENT DOCUMENTS

| | | | | |
|---|---|---|---|---|
| 5,166,595 A | * | 11/1992 | Leverich | H02J 7/008 320/139 |
| 5,498,995 A | * | 3/1996 | Szepesi | H02M 3/33507 327/101 |
| 6,268,710 B1 | * | 7/2001 | Koga | G01R 31/3624 320/116 |
| 2004/0257839 A1 | * | 12/2004 | Yang | H02M 3/33507 363/21.12 |
| 2007/0216357 A1 | * | 9/2007 | Ibaraki | H02J 7/0052 320/128 |

(Continued)

FOREIGN PATENT DOCUMENTS

CN 101630834 A 1/2010

OTHER PUBLICATIONS

Combined Chinese Office Action and Search Report issued Jun. 20, 2016 in Patent Application No. 201280060518.3 (with English translation of categories of cited documents).

*Primary Examiner* — Yalkew Fantu

(57) ABSTRACT

Aspects of the disclosure provide a circuit. The circuit includes a switch and a switch controller. The switch is between a first node that receives a first power supply and a second node, and is controlled to couple/decouple the second node with the first node to switch on/off a second power supply at the second node. The switch controller is configured to generate a switch control signal to control a charging current flowing through the switch to switch on the second power supply.

17 Claims, 7 Drawing Sheets

(56) References Cited

U.S. PATENT DOCUMENTS

| | | | |
|---|---|---|---|
| 2008/0150476 A1* | 6/2008 | Lamothe | G06K 19/0702 |
| | | | 320/107 |
| 2009/0314561 A1* | 12/2009 | Handa | F02N 11/0866 |
| | | | 180/65.25 |
| 2010/0164598 A1 | 7/2010 | Katou | |
| 2010/0259952 A1* | 10/2010 | Zhu | H02M 1/36 |
| | | | 363/20 |
| 2011/0221516 A1 | 9/2011 | Yamaoka et al. | |

* cited by examiner

| M1 | M2 | MODE | SW |
|---|---|---|---|
| 0 | 0 | SLEEP | TURN OFF SWITCHES |
| 1 | 0 | SLOW RAMP | SLOW CHARGING |
| 1 | 1 | FAST RAMP | FAST CHARGING |
| 0 | 1 | AWAKE | FULLY TURN ON SWITCHES |

| M1 | M2 | MODE | S1 | S2 | S3 | S4 | S5 |
|---|---|---|---|---|---|---|---|
| 0 | 0 | SLEEP | OPEN | OPEN | OPEN | CLOSE | OPEN |
| 1 | 0 | SLOW RAMP | CLOSE | OPEN | CLOSE | OPEN | CLOSE |
| 1 | 1 | FAST RAMP | CLOSE | OPEN | CLOSE | OPEN | OPEN |
| 0 | 1 | AWAKE | OPEN | CLOSE | OPEN | OPEN | OPEN |

METHOD AND APPARATUS FOR POWER SWITCHING

INCORPORATION BY REFERENCE

This present disclosure claims the benefit of U.S. Provisional Application No. 61/568,556, "Power Switch Architecture" filed on Dec. 8, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, power consumption is one of the dominant concerns facing a user who is purchasing a battery-powered electronic device. In an example, a mobile phone of low power consumption can have a long stand-by time. A user who prefers to charge the mobile phone less often may weigh the long stand-by time over other mobile phone features.

SUMMARY

Aspects of the disclosure provide a circuit. The circuit includes a switch and a switch controller. The switch is between a first node that receives a first power supply and a second node, and is controlled to couple/decouple the second node with the first node to switch on/off a second power supply at the second node. The switch controller is configured to generate a switch control signal to control a charging current flowing through the switch to switch on the second power supply.

In an embodiment, the switch controller is configured to generate the switch control signal to control a first charging current flowing through the switch during a first time duration and control a second charging current flowing through the switch during a second time duration to switch on the second power supply.

According to an aspect of the disclosure, the switch controller is coupled with the switch in a current mirror to control the charging current. In an example, the switch control signal is an analog signal. The switch controller is configured to generate the switch control signal in response to digital control signals from a power controller.

In an embodiment, the switch is a distributed switch that includes a plurality of sub-switches distributed in the circuit. Further, each sub-switch includes a plurality of P-type metal-oxide-semiconductor field effect transistors coupled together in parallel.

Further, in an example, the circuit includes functional circuits configured to operate when the second power supply is switched on.

Aspects of the disclosure provide a method. The method includes generating a switch control signal, providing the switch control signal to a switch between a first node that receives a first power supply and a second node, and controlling a charging current flowing through the switch to switch on a second power supply at the second node.

Aspects of the disclosure provide an integrated circuit (IC) chip. The IC chip includes a power controller and a circuit block. The power controller is configured to generate a control signal to the circuit block. The circuit block includes a switch and a switch controller. The switch is placed between a first node that receives a first power supply and a second node, and is controlled to couple/decouple the second node with the first node to switch on/off the second power supply. The switch controller is configured to generate a switch control signal in response to the control signal to control a charging current flowing through the switch to switch on the second power supply.

BRIEF DESCRIPTION OF THE DRAWINGS

Various embodiments of this disclosure that are proposed as examples will be described in detail with reference to the following figures, wherein like numerals reference like elements, and wherein:

FIG. 4B shows a table 450 for controlling the switch controller 440 according to an embodiment of the disclosure;

DETAILED DESCRIPTION OF EMBODIMENTS

Figure 1:
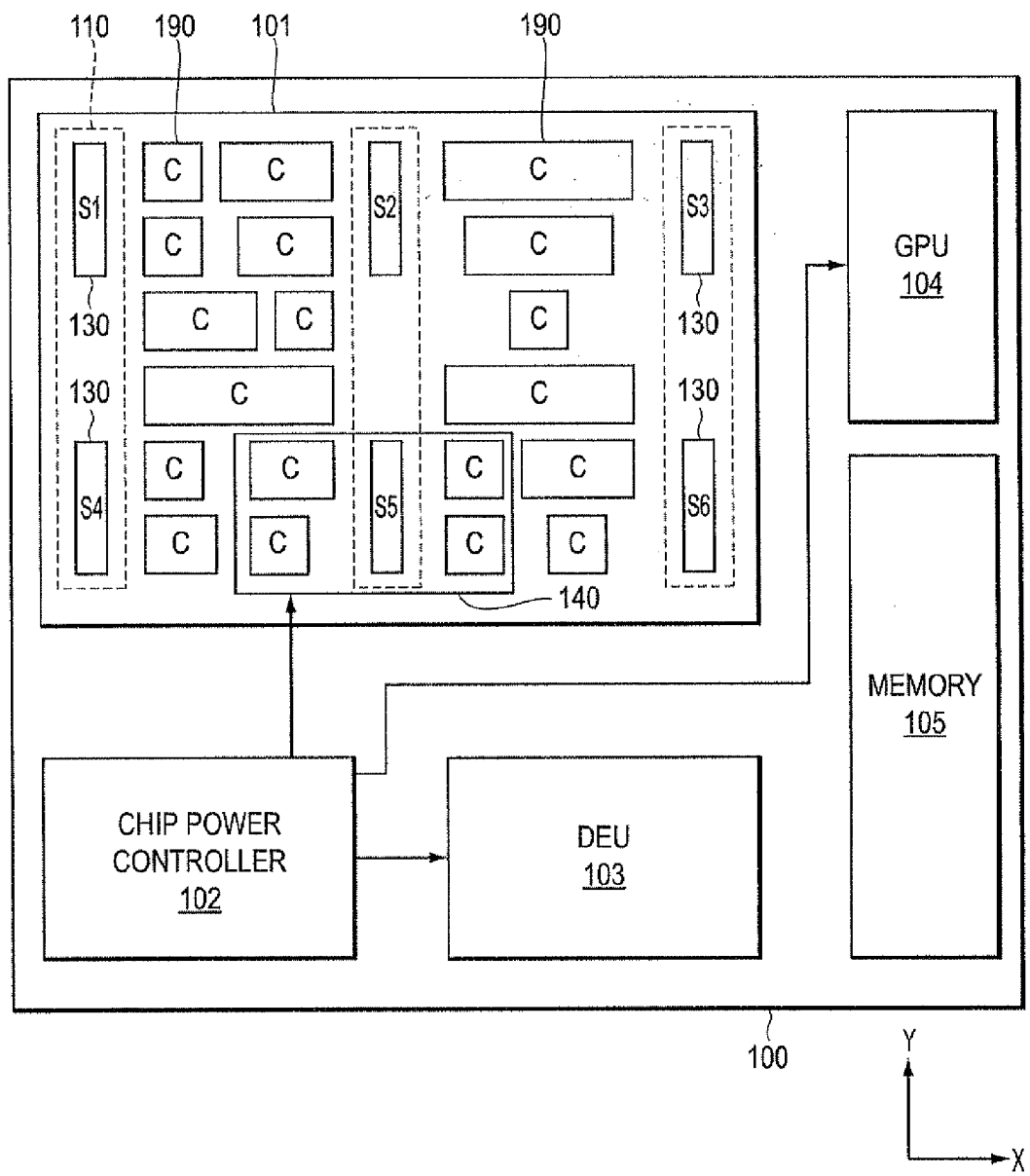
FIG. 1 shows a block diagram of an integrated circuit (IC) chip example 100 according to an embodiment of the disclosure.

FIG. 1 shows a block diagram of an integrated circuit (IC) chip example 100 according to an embodiment of the disclosure. The IC chip 100 can be any suitable IC chip that includes one or more functional circuit blocks that have switchable power supplies. The functional circuit blocks can be separately powered on/off during operation when the IC chip 100 is powered on. Thus, the functional circuit blocks can be powered off when their operations are not needed in order to save power.

In the FIG. 1 example, the IC chip 100 includes a central processing unit (CPU) 101, a chip power controller 102, a data encryption unit (DEU) 103, a graphics processing unit (GPU) 104, a memory block 105, and the like. In an example, the CPU 101, the DEU 103 and the GPU 104 have switchable power supplies and can be separately powered on/off during operation when the IC chip 100 is powered on.

Further, according to an embodiment of the disclosure, the chip power controller 102 is continuously powered on when the IC chip 100 is powered on. The chip power controller 102 provides control signals to the functional circuit blocks to switch on/off the switchable power supplies.

According to an aspect of the disclosure, at least one of the functional circuit blocks has a current controlled switchable power supply that a charging current to the switchable power supply during switching on is controlled. In an example, at time of switching on a switchable power supply in a functional circuit block, a transient current flows into the functional circuit block to charge various capacitors, such as gate capacitors, parasitic capacitors, and the like. Without control, the transient current can be large and cause voltage drop on a main power supply. The voltage drop on the main power supply introduces power supply noise to other circuits that operate under the main power supply. When the charging current is controlled, the main supply voltage can be maintained to be stable to reduce power supply noise.

In the FIG. 1 example, the CPU 101 is implemented using a distributed power switch architecture. Specifically, the CPU 101 includes a plurality of switch cells 130 that are distributed among a plurality of circuit cells 190. In an embodiment, the plurality of switch cells 130 is placed in parallel between a first power supply and a second power supply. The first power supply is a main power supply of the IC chip 100. Once the IC chip 100 is powered on, the main power supply is powered on and delivers power to the functional circuit blocks in the IC chip 100. The second power supply is a switchable power supply for the CPU 101. The second power supply is coupled to the first power supply via the plurality of switch cells 130, and provides electrical power to the plurality of circuit cells 190 when it is switched on.

Further, the CPU 101 includes a switch controller 140 that provides a switch control signal to control the plurality of switch cells 130. For example, the switch control signal can open the plurality of switch cells 130 to decouple the second power supply from the first power supply. Thus, the second power supply is switched off to stop providing electrical power to the plurality of circuit cells 190. The switch control signal can close the plurality of switch cells 130 to couple the second power supply to the first power supply. Thus, the second power supply is switched on to provide electrical power to the plurality of circuit cells 190.

According to an aspect of the disclosure, the plurality of circuit cells 190 is selected from a standard cell library to implement various CPU functions, such as addition, subtraction, logic operation, multiplication, division, and the like. Each of the circuit cells 190 can be any suitable functional circuit, such as a logic gate, a flip-flop, and the like. Generally, circuit cells from the standard cell library have a dimension in common, such that the circuit cells can be placed and aligned in rows or in columns.

In the FIG. 1 example, the circuit cells 190 are placed in rows that extend in X-axis. According to an aspect of the disclosure, a design process that places and routes the circuit cells 190 may leave unused spaces in the rows. In an example, the circuit cells 190 occupy about 94% of the space in rows, and leave about 6% of the space unused. In an embodiment, the unused space can be used to place the switch cells 130. In an embodiment, the unused space in the rows can be suitably aligned in columns to facilitate the placement of the switch cells 130 in columns, and facilitate routings of metal lines for transmitting the first and second power supplies and the switch control signal. The distributed power switch architecture utilizes unused spaces by the functional circuits, which previously may be filled with dummy cells, to implement the plurality of switch cells 130. Thus, the implementation of the distributed power switch architecture does not increase chip area, or the chip area increase due to the implementation of the distributed power switch architecture is not significant compared to the chip area.

According to an aspect of the disclosure, the switch cells 130 can be selected to allow design feature tradeoff, such as allow area, leakage, and turn-on resistance trade off. In an embodiment, a cell library provides various types of switch cells, and various sizes of switch cells. In an example, each switch cell is formed by one or more metal-oxide-semiconductor field effect transistors (MOSFETs). The cell library provides switch cells of different sizes of MOSFETs, such as different widths, different gate lengths, and the like, and different types of MOSFETs, such as different thresholds, and the like.

Switch cells of different sizes and types of transistors have different electrical and layout features. For example, a switch cell of a larger width has a relatively large driving power, but occupies a large area. In another example, a switch cell formed of transistors of a shorter gate length has a relatively large driving power per unit area, and a switch cell formed of transistors of a longer gate length has a relatively smaller leakage per unit area. In another example, a switch cell formed of transistors of a higher threshold has relatively low leakage current and a switch cell formed of transistors of a low threshold voltage has relatively large driving power.

Further, in an embodiment, each of the switch cells 130 includes built-in substrate taps and/or well taps as well as decoupling capacitors.

During a design process of the IC chip 100, when the circuit cells 190 are placed and routed, the switch cells 130 can be suitably selected and inserted in the IC chip 100 based on various requirements, such as leakage requirement, average voltage drop requirement, area requirement and the like. In an example, when an average voltage drop across each switch cell is required to ensure enough supply voltage for the operations of the CPU 101, the number of switch cells can be determined as a function of the current of the CPU 101 during operation, the turn-on resistance of each of the switch cell and the average voltage drop requirement.

It is noted that the switch cells 130 can have the same height as the circuit cells 190 or can have different height from the circuit cells 190. In the FIG. 1 example, the switch cells 130 have twice the height of the circuit cells 190. It is also noted that the switch cells 130 can be the same size and type or can have different sizes and types.

Further, according to an aspect of the disclosure, the switch controller 140 includes circuit cells coupled directly to the main power supply to generate a single switch control signal. The single switch control signal is distributed globally in the CPU 101 to control the plurality of switch cells 130. The plurality of switch cells 130 is coupled in parallel between the main power supply and the switched power supply, and is controlled by the single switch control signal. The single switch control signal is used to close and open the plurality of switch cells 130. In addition, the single switch control signal controls a transient current from the main power supply to the switchable power supply during a time duration to close the plurality of switch cells 130 and switch on the switchable power supply. The transient current is suitably controlled to avoid significant voltage change on the main power supply at the time of switching on the switchable power supply.

According to another aspect of the disclosure, the switch controller 140 can generate multiple switch control signals that are respectively distributed to control the switch cells 130. Thus, the switch cells 130 can be controlled by different switch control signals. Then, the switch control signals can be controlled to switch on the switch cells 130 at the same time or at the different time to further improve the granularity of the in rush current reduction.

In an embodiment, the switch controller 140 generates a first switch control signal and a second switch control signal. The first switch control signal is distributed to control a first plurality of switch cells 130, and the second switch control signal is distributed to control a second plurality of switch cells 130. The first and second switch control signals can be used to control the switching current and switching timings of the first and the second plurality of switch cells. In an example, the first switch control signal and the second switch control signal are generated based on a signal, such as a digital signal, an analog signal, and the like that is indicative of a process characteristic of the IC chip, such as a fast IC chip or a slow IC chip. In an embodiment, the signal is generated from a process monitor that is placed on the same IC chip. The process monitor monitors the process characteristic of the IC chip. In another embodiment, the signal is generated based on a value in a non-volatile memory on the IC chip. The value can be determined based on a testing result of the process characteristic of the IC chip, and is then stored on the chip. In an example, when the signal is indicative of a fast chip, the first switch control signal and the second switch control signal are generated with different timings to control the first and second plurality of switch cells to perform switching activities at different time. When the signal is indicative of a slow chip, the first switch control signal and the second control signal are generated with the same timings to control the first and second plurality of switch cells to perform switching activities at about the same time.

It is noted that, for clarity and brevity, the blocks in the FIG. 1 example are not drawn to scale.

Figure 2A:
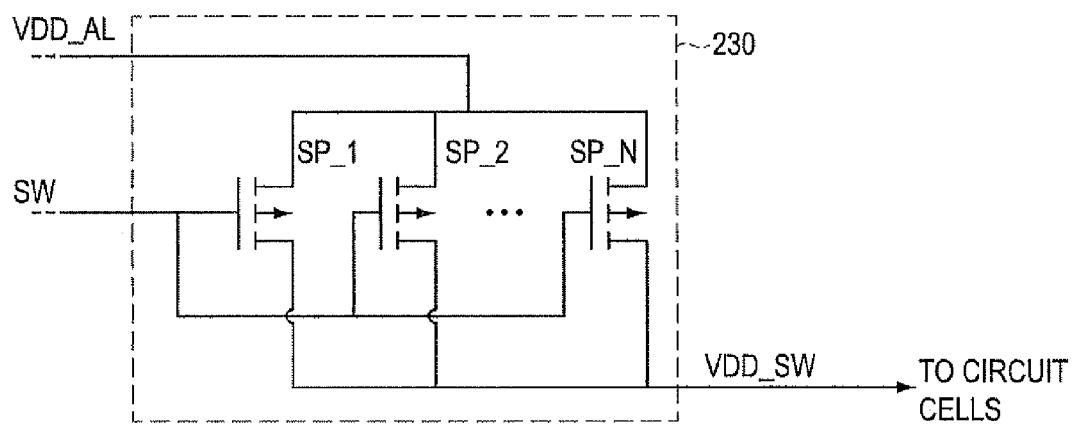
FIG. 2A shows a schematic diagram of a power switch example 230 according to an embodiment of the disclosure.

FIG. 2A shows a schematic diagram of a switch cell example 230 according to an embodiment of the disclosure. In an example, the switch cells 230 can be used in the FIG. 1 example as a switch cell 130. The switch cell 230 has a first power supply node to receive a main power supply VDD_AL that is always on when an IC chip, such as the IC chip 100, is powered on, a control node to receive a switch control signal SW, and a second power supply node to deliver a switchable power supply VDD_SW based on the switch control signal SW.

In the FIG. 2A example, the switch cell 230 includes a plurality of P-type MOSFET transistors SP_1 to SPN (N is a positive integer) that are coupled together in parallel. Specifically, each of the P-type MOSFET transistors SP_1 to SPN has a gate terminal and two channel terminals (e.g., a source terminal and a drain terminal). The gate terminals of the P-type MOSFET transistors SP_1 to SPN are coupled together to receive the switch control signal SW. The source terminals of the P-type MOSFET transistors SP_1 to SP_N are coupled to the first power supply node to receive the main power supply VDD_AL, and the drain terminals are coupled to the second power supply node to drive the switchable power supply VDD_SW.

In an embodiment, each of the P-type MOSFET transistors SP_ to SP_N is identified in a layout of the IC chip by a polysilicon finger that forms the transistor gate. Thus, the number of fingers in the layout for the switch cell 230 indicates the number of P-type MOSFET transistors. In an example, the P-type MOSFET transistors formed by the polysilicon fingers and other suitably layers, such as an active layer, and the like, are of the same gate length, gate width and gate oxide thickness. Then, the leakage current of the switch cell 230 is proportional to the number of fingers, the turn-on resistance of the switch cell 230 is inversely proportional to the number of fingers, and the driving power is proportional to the number of fingers. In addition, electrical parameters of the switch cell 230 also depend on the width of the transistor gate, the length of the transistor gate, and gate oxide thickness. It is noted that the switch cell 230 can be schematically drawn as one P-type MOSFET transistor with cumulative electrical parameters.

It is noted that a cell library can include a plurality of switch cells 230 of different electrical parameters. For example, the cell library can vary the number of fingers, the gate length, the gate oxide thickness, and the like to form the plurality of switch cells 230 of different electrical parameters. Then, the suitable switch cells 230 can be selected to be used in an IC chip based on design tradeoff.

Figure 2B:
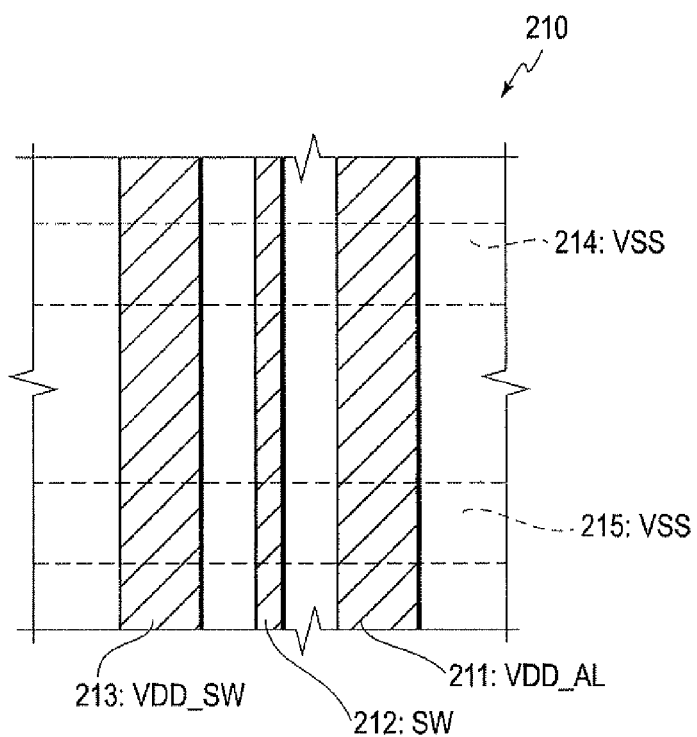
FIG. 2B shows a diagram of layout layers example 210 according to an embodiment of the disclosure.

FIG. 2B shows a diagram of layout example 210 according to an embodiment of the disclosure. The layout 210 can be used in a layout portion 110 of the FIG. 1 example. The layout 210 shows a first metal layer and a second metal layer. The first metal layer forms a first plurality of metal strips 214 and 215 extending in a first direction, such as horizontal direction, and a second metal layer forms a second plurality of metal strips 211-213 extending in a second direction, such as vertical direction. In the FIG. 2B example, the first plurality of metal strips 214 and 215 is used for distributing a power supply of a low voltage, such as VSS. The second plurality of metal strips 211-213 is used for distributing the main power supply VDD_AL, the switch control signal SW, and the switchable power supply VDD_SW.

According to an aspect of the disclosure, the metal strip 212 to transmit the switch control signal SW is sandwiched between the metal strips 211 and 213 to transmit the main power supply VDD_AL and the switchable power supply VDD_SW. This layout feature shields switching noise from other circuits to the switch control signal SW.

Figures 3A, 3B:
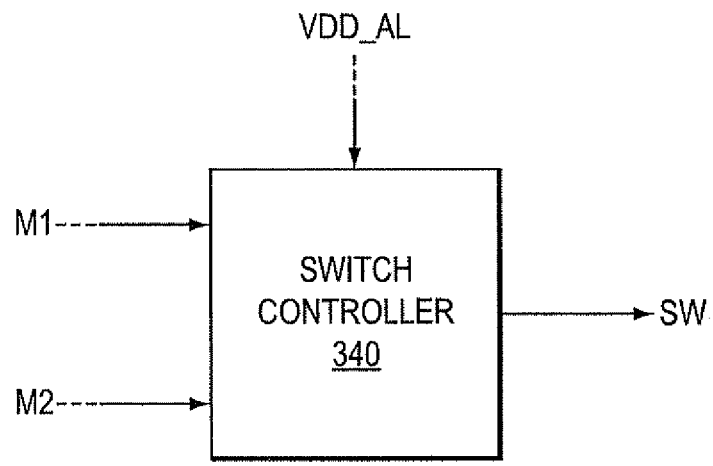
FIG. 3A shows a diagram of a switch controller example 340 that provides the switch control signal to the switch cell 230.
FIG. 3B shows a function table of the switch controller 340 according to an embodiment of the disclosure.

FIG. 3A shows a diagram of a switch controller example 340 that provides the switch control signal to the switch cell 230; and FIG. 3B shows a function table of the switch controller 340 according to an embodiment of the disclosure. The switch controller 340 can be used as the switch controller 140 in the FIG. 1 example. The switch controller 340 receives the main power supply VDD_AL that is always on when the IC chip 100 is powered on. Further, the switch controller 340 receives a mode control signal, for example, from the chip power controller 102 and generates the switch control signal SW based on the mode control signal.

In the FIGS. 3A and 3B example, the mode control signal includes two digital binary bits M1 and M2. Based on the two bits, the switch controller 340 generates the switch control signal SW in analog in an example. The switch control signal SW is used to configure the switch cell 230 into a mode indicated by the mode control signal. It is noted that the mode control signal can include any number of bits to control the switch cell 230 into multiple modes.

Specifically, in the FIG. 3B example, when both M1 and M2 are logic "0", the mode control signal is indicative of a sleep mode, the switch controller 340 generates the switch control signal to have a first level, such as a high voltage level, to turn off the P-type MOSFET transistors SP_1 to SP_N, and thus the switch cell 230 can be open, and the switchable power supply VDD_SW is switched off.

When M1 is logic "1" and M2 is logic "0", the mode control signal is indicative of a slow ramp mode. The switch controller 340 generates the switch control signal in a manner to control a charging current flowing through the switch cell 230 from the main power supply VDD_AL to the switchable power supply VDD_SW at a relatively low level. The switchable power supply VDD_SW can ramp up with a relatively low charging current.

When M1 is logic "1" and M2 is logic "1", the mode control signal is indicative of a fast ramp mode. The switch controller 340 generates the switch control signal in a manner to control the charging current flowing through the switch cell 230 from the main power supply VDD_AL to the switchable power supply VDD_SW at a relatively high level. The switchable power supply VDD_SW can ramp up with a relatively larger charging current.

When M1 is logic "0" and M2 is logic "1", the mode control signal is indicative of an awake mode. The switch controller 340 generates the switch control signal to have a second level, such as a low voltage level, to completely turn on the P-type MOSFET transistors SP_1 to SP_N, and thus the switch cell 230 is closed.

Figure 4A:
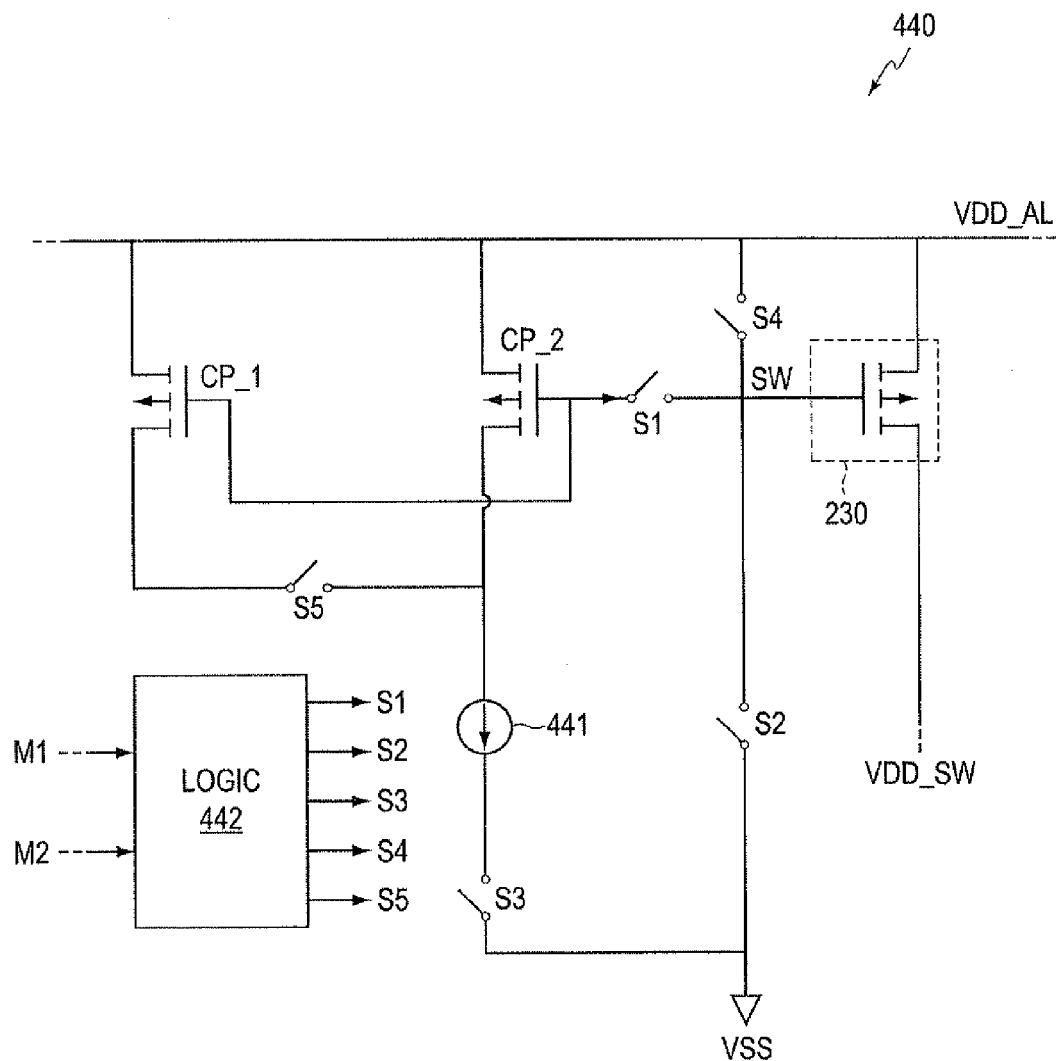
FIG. 4A shows a schematic diagram of a switch controller example 440 according to an embodiment of the disclosure.

FIG. 4A shows a schematic diagram of a switch controller example 440 according to an embodiment of the disclosure. The switch controller 440 can be configured to provide the switch control signal in the FIG. 3B example. The switch controller 440 operates based on the main power supply VDD_AL, receives the mode control signals formed of M1 and M2, and generates the switch control signal to control the switch cell 230 based on the mode control signals.

Specifically, the switch controller 440 includes two P-type MOSFET transistors CP_1 and CP_2, five switches S1-S5 and a current source 441. These components are coupled together as shown in FIG. 4A. Further, the switch controller 440 includes a logic circuit 442 configured to generate control signals to control the switches S1-S5 based on the mode control signal. It is noted that the switches S1-S5 can be implemented using any suitable components, such as MOSFET transistors.

FIG. 4B shows a table 450 to control the switches S1-S5 based on the mode control signal. When both M1 and M2 are logic "0", the mode control signal is indicative of a sleep mode. The switches S1, S2, S3 and S5 are controlled to be open, and the switch S4 is controlled to be close. Thus, the switch control signal SW has about the same voltage level as the main power supply VDD_AL, and thus can turn off the P-type MOSFET transistors SP_1 to SP_N in the switch cell 230.

When M1 is logic "1" and M2 is logic "0", the mode control signal is indicative of a slow ramp mode. The switches S2 and S4 are controlled to be open, and the switches S1, S3 and S5 are controlled to be closed. The switch controller 440 and the switch cell 230 are coupled together in a current mirror. The current flowing through the switch cell 230 depends on the current flowing through the P-type MOSFET transistor CP_2. Because the P-type MOSFET transistors CP_1 and CP_2 share the current provided by the current source 441, the P-type MOSFET transistor CP_2 conducts a portion of the current provided by the current source 441, and thus the charging current flowing through the switch cell 230 from the main power supply VDD_AL to the switchable power supply VDD_SW is relatively low. Then, the switchable power supply VDD_SW ramps up with a relatively low charging current and the voltage of the main power supply VDD_AL can be maintained to be relatively stable.

When M1 is logic "1" and M2 is logic "1", the mode control signal is indicative of a fast ramp mode. The switches S2, S4 and S5 are controlled to be open, and the switches S1 and S3 are controlled to be closed. The switch controller 440 and the switch cell 230 are coupled together in a current mirror. The current flowing through the switch cell 230 depends on the current flowing through the P-type MOSFET transistor CP_2. Because the entire current provided by the current source 441 flows through the P-type MOSFET transistor CP_2, the P-type MOSFET transistor CP_2 has a relatively high level of current, and thus the charging current flowing through the switch cell 230 from the main power supply VDD_AL to the switchable power supply VDD_SW is relatively high. The switchable power supply VDD_SW ramps up with a relatively large charging current.

When M1 is logic "0" and M2 is logic "1", the mode control signal is indicative of an awake mode. The switches S1, S3, S4 and S5 are controlled to be open, and the switch S2 is controlled to be close. The switch control signal has about the same voltage level as the low voltage supply VSS and thus can completely turn on the P-type MOSFET transistors $SP_1$ to $SP\_N$ in the switch cell 230. In an example, switch cells 230 can be suitably selected and placed in a circuit to cause a relatively small voltage drop on the switch cells 230, such as in the order of mv. Then, the switchable power supply VDD_SW has about the same voltage level as the main power supply VDD_AL.

Figure 4C:
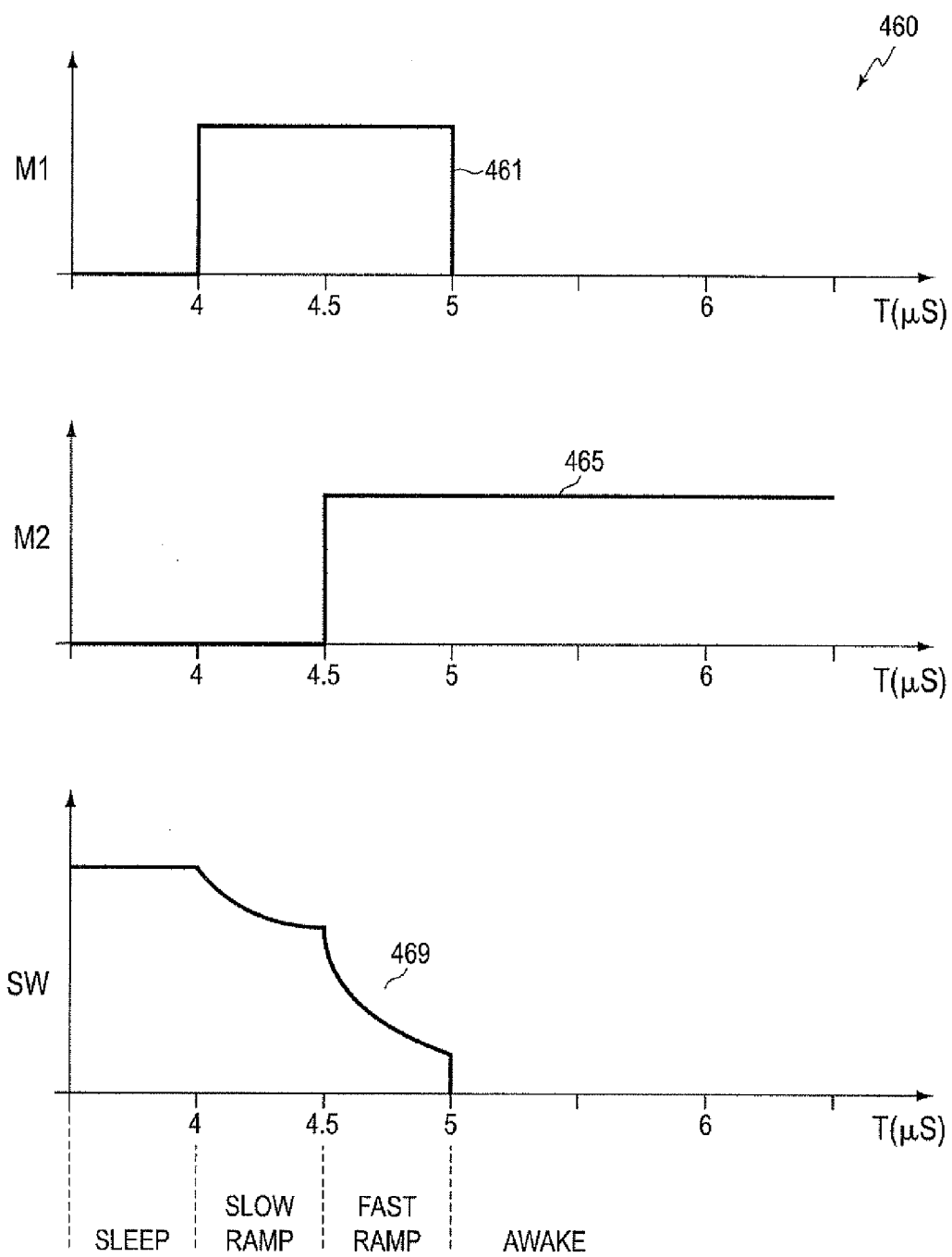
FIG. 4C shows a plot 460 of waveforms for the switch controller 440 according to an embodiment of the disclosure.

FIG. 4C shows a plot 460 of waveforms for the switch controller 440 according to an embodiment of the disclosure. The plot 460 includes a first waveform 461 and a second waveform 465 for the mode control signal formed of M1 and M2, and a third waveform 469 for the switch control signal SW.

In an example, initially, the CPU 101 is powered off. At about 4 μs of time, the chip power controller 102 determines to switch on the CPU 101 in about 1 μs. The chip power controller 102 switches M1 from logic "0" to logic "1" at 4 μs to control the switch cells to enter a slow ramp mode to slowly charge the switchable power supply VDD_SW. At about 4.5 μs, the chip power controller 102 switches M2 from logic "0" to logic "1" to control the switch cells to enter a fast ramp mode to charge the switchable power supply VDD_SW faster. At about 5 μs, the chip power controller 102 switches M1 from logic "1" to logic "0" to completely turn on the switchable power supply VDD_SW.

It is noted that the charging current in the slow ramp mode and the fast ramp mode are suitably determined that after the slow ramp mode charging and fast ramp mode charging, a difference between the main power supply VDD_AL and the switchable power supply VDD_SW is relatively small, such as smaller than a threshold, or about zero. Then, when the switch cells 230 are completely turned on, a final in-rush current at about 5 μs is relatively low, and does not cause significant voltage drop on the main power supply VDD_AL.

The example in FIGS. 4A-4C includes two charging levels. The example can be suitably modified to have other suitable number of charging levels, such as one charging level, or more than two charging levels. The number of charging levels and the charging current of the charging levels can be suitably determined, for example, based on a cumulative capacitance at the node of the switchable power supply VDD_SW, the time duration for charging the node, and the like, to limit the charging current during the time duration to avoid significant voltage drop on the main power supply VDD_AL, and to ensure the difference between the main power supply VDD_AL and the switchable power supply VDD_SW to be relatively small at the end of the time duration before the switch cells 230 being completely turned on.

Figure 5:
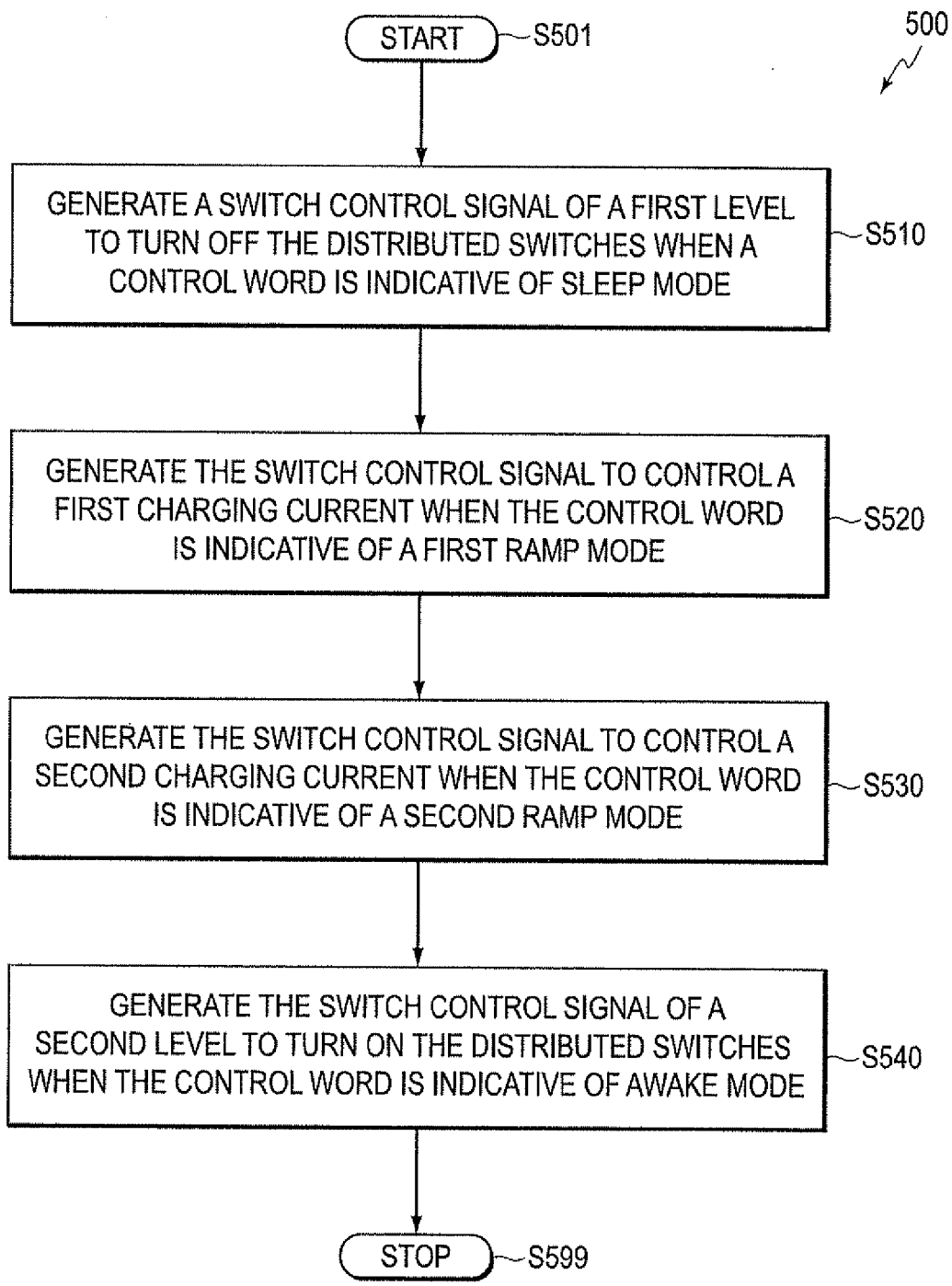
FIG. 5 shows a flow chart outlining a process example 500 according to an embodiment of the disclosure.

FIG. 5 shows a flow chart outlining a process example 500 to be executed by the switch controller 440 according to an embodiment of the disclosure. The process starts at S501 and proceeds to S510.

At S510, the switch controller 440 receives a control word, such as the mode control signal formed by M1 and M2. The control word is indicative of a sleep mode. In response to the control word, the switch controller 440 generates a switch control signal of a first level. The switch control signal is provided to distributed switches, such as the switch cells 130 in the FIG. 1 example, to open the distributed switches, and switch off the switchable power supply VDD_SW. Then, any circuits coupled to the switchable power supply VDD_SW can sleep.

At S520, the control word is indicative of a first ramp mode, such as the slow ramp mode. The switch controller 440 generates the switch control signal to control a first charging current, such as a relatively low charging current, of the distributed switches. In an example, the switch controller 440 is coupled to the distributed switches to form a current mirror to control the current in the distributed switches. The switchable power supply VDD_SW ramps up with the first charging current.

At S530, the control word is indicative of a second ramp mode, such as the fast ramp mode. The switch controller 440 generates the switch control signal to control a second charging current, such as a relatively large charging current, of the distributed switches. The switchable power supply VDD_SW ramps up with the second charging current.

At S540, the control word is indicative of an awake mode. The switch controller 440 generates the switch control signal of a second level to close the distributed switches. The switchable power supply VDD_SW is completely switched on, and any circuits coupled to the switchable power supply VDD_SW can wake up. Then, the process proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
a switch between a first node that receives a first power supply and a second node, the switch being controlled to couple/decouple the second node with the first node to switch on/off a second power supply at the second node; and
a switch controller configured to generate a switch control signal to control a first charging current flowing through the switch during a first time duration and control a second charging current flowing through the switch during a second time duration to switch the second power supply.

2. The circuit of claim 1, wherein the switch controller is coupled with the switch in a current mirror to control the charging current.

3. The circuit of claim 1, wherein the switch control signal is an analog signal.

4. The circuit of claim 3, wherein the switch controller is configured to generate the switch control signal in response to digital control signals from a power controller.

5. The circuit of claim 1, wherein the switch is a distributed switch that includes a plurality of sub-switches distributed in the circuit.

6. The circuit of claim 5, wherein each sub-switch includes a plurality of P-type metal-oxide-semiconductor field effect transistors coupled together in parallel.

7. The circuit of claim 1, further comprising:
functional circuits configured to operate when the second power supply is switched on.

8. A method, comprising:
generating a switch control signal in response to a control signal;
providing the switch control signal to a switch between a first node that receives a first power supply and a second node; and
controlling a first charging current flowing through the switch when the control signal is indicative of a first charging mode and controlling a second charging current flowing through the switch when the control signal is indicative of a second charging mode to switch on a second power supply at the second node.

9. The method of claim 8, wherein controlling the charging current flowing through the switch to switch on the second power supply further comprises:
mirroring the charging current with a reference current.

10. The method of claim 8, wherein providing the switch control signal to the switch between the first node that receives the first power supply and the second node further comprises:
providing the switch control signal to a plurality of distributed switches.

11. The method of claim 8, wherein generating the switch control signal in response to the control signal further comprises:
generating the switch control signal in analog in response to the control signal in digital.

12. An integrated circuit (IC) chip, comprising:
a power controller configured to generate a control signal to a circuit block; and
the circuit block that includes:
a switch between a first node that receives a first power supply and a second node, the switch being controlled to couple/decouple the second node with the first node to switch on/off the second power supply; and
a switch controller configured to generate a switch control signal in response to the control signal to control a first charging current flowing through the switch during a first time duration and control a second charging current flowing through the switch during a second time duration to switch on the second power supply.

13. The IC chip of claim 12, wherein the switch controller is coupled with the switch in a current mirror to control the charging current.

14. The IC chip of claim 12, wherein the switch control signal is an analog signal.

15. The IC chip of claim 12, wherein the switch is a distributed switch that includes a plurality of sub-switches distributed in the circuit block.

16. The IC chip of claim 15, wherein each sub-switch includes a plurality of P-type metal-oxide-semiconductor field effect transistors coupled together in parallel.

17. The IC chip of claim 12, wherein the circuit block further comprises:
functional circuits configured to operate when the second power supply is switched on.

* * * * *